United States Patent [19]

Okuda et al.

[11] Patent Number: 4,933,263
[45] Date of Patent: Jun. 12, 1990

[54] FORMING METHOD OF RESIST PATTERN

[75] Inventors: Yoshimitsu Okuda, Takatsuki; Morio Inoue, Ibaraki; Yukio Takashima, Osaka; Tohru Ohkuma, Ibaraki, all of Japan

[73] Assignee: Matsushita Electronics Corporation, Osaka, Japan

[21] Appl. No.: 156,663

[22] Filed: Feb. 17, 1988

[30] Foreign Application Priority Data

Feb. 17, 1987 [JP] Japan .................................. 62-33864

[51] Int. Cl.$^5$ .............................................. G03C 5/16
[52] U.S. Cl. .................................... 430/326; 430/328; 430/330
[58] Field of Search ....................... 430/326, 328, 330

[56] References Cited
FOREIGN PATENT DOCUMENTS 116838  6/1986  Japan ................................... 430/328

OTHER PUBLICATIONS

Pacansky, "Exposure Procedure for Positive Photoresists", IBM Tech. Disc. Bulletin, vol. 20(7), Dec. 1977.

*Primary Examiner*—Jose Dees
*Attorney, Agent, or Firm*—Wenderoth, Lind & Ponack

[57] ABSTRACT

Disclosed is a method of forming a resist pattern by exposing a novolak type positive photoresist to ultraviolet light in a pattern, irradiating the entire surface with far ultraviolet light with wavelength of 200 to 320 nm in an atmosphere with inert gas partial pressure ratio of 90% or more, and developing it. According to this method, a specific gradient of solubility in developing solution becoming higher from the surface toward the depthwise direction is provided, and a contrast value of twice as high as in the conventional method can be obtained, and a resist pattern of high aspect ratio is formed.

2 Claims, 1 Drawing Sheet

FORMING METHOD OF RESIST PATTERN

BACKGROUND OF THE INVENTION

This invention relates to a method of forming a fine resist pattern possessing a sectional shape of a high aspect ratio, in the resist mask forming process in one of the steps of fabricating a semiconductor device.

In forming a resist pattern, a generally employed method is a so-called single-layer resist method comprising a step of applying and forming a single photoresist layer on a semiconductor substrate, and a step of exposing and developing by using an ultraviolet light. In this method, the resolution is low and the contrast is not high because the gradient of the exposed degree along the depthwise direction and the gradient of the film thickness reduction by a developing solution at the side wall of the unexposed part along the depthwise direction are overlapped. Furthermore, the sectional shape of the formed resist pattern may present such a shape that the side wall is an inclined surface with respect to the substrate surface. As a method of realizing a higher aspect ratio as compared with such method, a method of heating the resist film formed on the substrate, exposing in a pattern to near ultraviolet light, exposing the whole surface to far ultraviolet light, and removing the portion exposed to the near ultraviolet light is disclosed in Japanese Laid-open Patent No. 61-116838, Laid-opened June 4, 1986, and in the Collected Papers of the 47th Autumn Meeting of the Japan Society of Applied Physics, page 540, 30a-P-3, published Sept. 27, 1986.

According to the conventional resist pattern forming method combining the pattern exposure by near ultraviolet ray light and flood exposure by far ultraviolet light, although it is possible to realize a higher aspect ratio than in the conventional single-layer resist method, it was not fully satisfactory with a contrast value (gamma-value) of the resist, from the viewpoint of the ultra fine pattern and there was room for further improvement.

SUMMARY OF THE INVENTION

It is a primary object of this invention to present a method capable of obtaining a very high contrast value as compared with the contrast value of the resist realized in the above-discussed method.

In order to achieve the above and other objects, this invention comprises the following steps: a step of transferring a specified pattern on a novolak type positive photoresist layer applied on a semiconductor substrate by ultraviolet light with a wavelength exceeding 320 nm, a step of providing with a gradient of solubility in a developing solution becoming higher from the surface side toward the depthwise direction by treating said semiconductor substrate in an atmosphere in which an inert gas is used having a partial pressure ratio of 90% or more, and irradiating the entire surface of said novolak type positive photoresist layer is irradiated with far ultraviolet light having a wavelength range of 200 to 320 nm, and a step of forming said specified pattern by developing said novolak type positive photoresist.

According to the resist pattern forming method of this invention, the novolak type positive resist layer immediately before the developing process is provided with a gradient of solubility in the developing solution becomes continuously higher from the surface side toward the depthwise direction, and exposing the surface of the photoresist layer with in flooding with far ultraviolet in an inert atmosphere in which the partial pressure ratio of inert gas is 90% or more, whereby the contrast value of the resist is greatly enhanced.

DETAILED DESCRIPTION OF THE INVENTION

Figure 1:
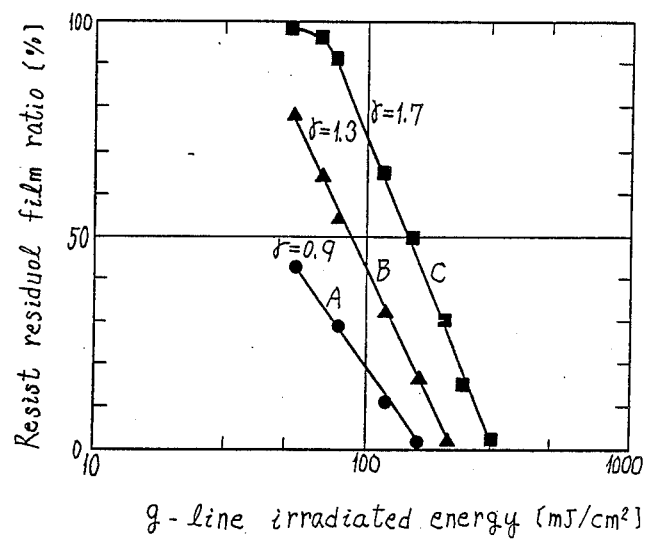
FIG. 1 is a diagram to show the result of experiments representing the contrast enhancing effect of the photoresist pattern by the method of this invention.

This invention is described in detail below.

As a photoresist to be applied on a silicon substrate, a positive photoresist of a novolak resin material was prepared, and it was applied on the silicon substrate in a thickness of 2.4 $\mu$m, and a mask pattern was transferred. For this transfer, a g-line (436 nm) was used. Next, in order to provide the photoresist with a solubility gradient which is one of the features of this invention, a hot plate on which a silicon substrate was mounted was put in an atmosphere with a nitrogen partial pressure ratio of 90%, and the entire surface was irradiated with far ultraviolet light in the condition of heating to 100° C. by the hot plate. For this total irradiation, an ultraviolet stabilizer was used, and the illumination during irradiation was set at 120 mW/cm$^2$ as measured by 254 a nm illuminometer. After that, by making use of the paddle development, the surface was developed by means of a developing solution, and a photoresist pattern was formed.

FIG. 1 shows the results of comparative experiments of the contrast value (gamma-value) conducted in order to confirm the effects of this invention, in which the axis of abscissas denotes the g-line irradiation energy (mJ/cm$^2$), the axis of ordinates represents the exposed part resist residual ratio after development (%), A refers to the case without far ultraviolet irradiation, B is the curve when the entire surface is irradiated with far ultraviolet light for 3 seconds in the air, and C refers to the contrast curve when the entire surface is irradiated with far ultraviolet light for 3 seconds in an atmosphere with nitrogen partial pressure ratio of 90% or more.

As clear from FIG. 1, the contrast value (gamma-value) of the resist was 0.9 in the conventional method A to develop immediately after exposure by ultraviolet light, while it was improved nearly twice to 1.7 in the method C of wherein developing takes place after a total irradiation with far ultraviolet light in an atmosphere with a nitrogen partial pressure ratio of 90% or more. At the same time, it was confirmed that the reproducibility was also high. On the other hand, in the conventional method B in which the atmosphere for total irradiation with ultraviolet light was merely in the air, instead of an atmosphere in which the nitrogen partial pressure ratio of 90% or more is employed, which is a feature of this invention, the contrast value was 1.3, and although it was higher than in the conventional method A, such high contrast value in the method of this invention could not be obtained.

Meanwhile, the wavelength of the far ultraviolet light for providing a solubility gradient by the flood exposure in this invention is preferably in a range of 200 to 320 nm. If the wavelength of ultraviolet light is less than 200 nm, it is hard to penetrate into the photoresist layer, and it is difficult to obtain a favorable solubility gradient necessary for gaining a high contrast value. To the contrary, when the wavelength of ultraviolet light is over 320 nm, the selectivity of setting the solubility rate smaller in the developing solution in the unexposed part as compared with the pattern transferred part is reduced, and the optical crosslinking reaction in the photo-resist is likely to occur also in the unexposed part. In this invention, furthermore, as the atmosphere for the flood exposure with far ultraviolet light is employed, the condition of nitrogen partial pressure ratio of 90% or more is established. If the nitrogen partial pressure ratio is less than 90%, a thin surface skin film which is not soluble in a developing solution may be formed on the surface of the novolak type positive resist layer, which may give rise to defects in the resist pattern.

In the above embodiment, incidentally, nitrogen was contained in the atmosphere for the flood exposure, but instead of nitrogen, argon, helium or an other inert gas can be used. In this case, too, by setting the partial pressure ratio over 90%, it has been confirmed that the above inconvenience can be securely prevented. Further, in the above embodiment, the heating temperature of the hot plate, on which a silicon substrate is mounted, is set at 100° C., however, although the heating is not essential for this invention, it is confirmed that the range of the heating temperature from about 80° C. to about 120° C. is effective.

As described herein, the manufacturing method of this invention is capable of forming a resist pattern of high contrast and high aspect ratio easily and stably, and it is highly valuable industrially as the mass-producing technology of semiconductor devices.

What we claim is:

1. A method of forming a resist pattern comprising:

transferring a specified pattern on a novolak positive photoresist layer applied on a semiconductor substrate by ultraviolet light with a wavelength exceeding 320 nm;

irradiating the entire surface of said novolak positive photoresist layer with far ultraviolet light having a wavelength range of from 200 nm to 320 nm in an inert atmosphere with an inert gas partial pressure ratio of 90% or more and under such conditions that said semiconductor substrate is heated, to provide said novolak positive photoresist layer with a gradient of solubility in a developing solution which becomes higher from a surface side toward a depthwise direction; and forming said specified pattern by developing said novolak positive photoresist layer.

2. A method according to claim 1, in which the inert gas is selected from the group consisting of nitrogen, argon and helium.

* * * * *